United States Patent
Podder et al.

(10) Patent No.: US 9,411,014 B2
(45) Date of Patent: Aug. 9, 2016

(54) REORDERING OR REMOVAL OF TEST PATTERNS FOR DETECTING FAULTS IN INTEGRATED CIRCUIT

(71) Applicant: Synopsys, Inc., Mountain View, CA (US)

(72) Inventors: Sushovan Podder, Bangalore (IN); Parthajit Bhattacharya, Bangalore (IN); Rohit Kapur, Cupertino, CA (US)

(73) Assignee: Synopsys, Inc., Mountain View, CA (US)

(*) Notice: Subject to any disclaimer, the term of this patent is extended or adjusted under 35 U.S.C. 154(b) by 89 days.

(21) Appl. No.: 14/222,485

(22) Filed: Mar. 21, 2014

(65) Prior Publication Data

US 2014/0289579 A1    Sep. 25, 2014

(30) Foreign Application Priority Data

Mar. 22, 2013   (IN) .......................... 1262/CHE/2013

(51) Int. Cl.
| | | |
|---|---|---|
| *G01R 31/28* | (2006.01) | |
| *G06F 11/00* | (2006.01) | |
| *G01R 31/3185* | (2006.01) | |
| *G01R 31/3183* | (2006.01) | |

(52) U.S. Cl.
CPC .. *G01R 31/318547* (2013.01); *G01R 31/31835* (2013.01)

(58) Field of Classification Search
CPC .................... G01R 31/31547; G01R 31/31835
See application file for complete search history.

(56) References Cited

U.S. PATENT DOCUMENTS

| | | |
|---|---|---|
| 5,475,695 A | 12/1995 | Caywood et al. |
| 6,122,756 A | 9/2000 | Baxter et al. |
| 6,185,707 B1 | 2/2001 | Smith et al. |
| 6,288,955 B1 | 9/2001 | Shibano et al. |
| 6,418,545 B1 | 7/2002 | Adusumilli |
| 6,557,129 B1 | 4/2003 | Rajski et al. |
| 6,618,830 B1 | 9/2003 | Balachandran et al. |
| 7,139,948 B2 | 11/2006 | Rearick et al. |
| 7,370,254 B2 | 5/2008 | Rajski et al. |
| 7,859,285 B2 | 12/2010 | Sheu et al. |
| 8,261,142 B2 | 9/2012 | Guo et al. |
| 8,694,951 B1 | 4/2014 | Prasanna et al. |
| 2005/0055617 A1 | 3/2005 | Wang et al. |
| 2007/0061637 A1 | 3/2007 | Ward et al. |
| 2007/0143651 A1 | 6/2007 | Kiryu |
| 2007/0179731 A1 | 8/2007 | Suri et al. |
| 2007/0234169 A1 | 10/2007 | Rajski et al. |
| 2008/0294955 A1 | 11/2008 | Kapur et al. |

(Continued)

OTHER PUBLICATIONS

Chakrabarty, K. et al., "Test Planning for Modular Testing of Hierarchical SOCs," IEEE Transactions on Computer-Aided Design of Integrated Circuits and Systems, Mar. 2005, pp. 435-448, vol. 24, No. 3.

(Continued)

*Primary Examiner* — Sam Rizk
(74) *Attorney, Agent, or Firm* — Fenwick & West LLP

(57) ABSTRACT

A method for reordering a test pattern set for testing an integrated circuit is disclosed. A productivity index is computed for each test pattern in a test pattern set. The productivity index of a first test pattern and the productivity index of a second test pattern are compared. If the productivity index of the second test pattern is larger than the productivity index of the first test pattern, the location of the first test pattern and the second test pattern are swapped.

20 Claims, 7 Drawing Sheets

(56) References Cited

U.S. PATENT DOCUMENTS

| | | |
|---|---|---|
| 2008/0301510 A1 | 12/2008 | Kapur et al. |
| 2009/0240458 A1* | 9/2009 | Desineni et al. ............ 702/120 |
| 2010/0017760 A1 | 1/2010 | Kapur et al. |
| 2010/0192030 A1 | 7/2010 | Kapur et al. |
| 2011/0258498 A1 | 10/2011 | Chandra et al. |

OTHER PUBLICATIONS

Chandra, A. et al., "Scalable Adaptive Scan (SAS)," EDAA, 2009, 6 pages.

Devanathan, V.R. et al., "Reducing SoC Test Time and Test Power in Hierarchical Scan Test: Scan Architecture and Algorithms," IEEE 20th Intl Conference on VLSI Design, VLSID'07, 2007, 6 pages.

Dutta et al., "Using Limited Dependence Sequential Expansion for Decompressing Test Vectors," IEEE Int'l Test Conference, 2006, Paper 23.1, pp. 1-9.

Gonciari, P.T. et al., "Compression Considerations in Test Access Mechanism Design," IEE Proc.-Comput. Digit. Tech, Jan. 2005, pp. 89-96, vol. 152, No. 1.

Iyengar, V. et al., "A Unified Soc Test Approach Based on Test Data Compression and Tam Design," Proceedings of the 18th IEEE International Symposium on Defect and Fault Tolerance in Vlsi Systems, (Dft'03), IEEE, 2003, 8 pp.

Iyengar , V. et al., "Test Access Mechanism Optimization, Test Scheduling, and Tester Data vol. Reduction for System-on-Chip," IEEE Transactions on Computers, Dec. 2003, pp. 1619-1632, vol. 52, No. 12.

Kapur, R. et al., "Manufacturing Test of SoCs," Proceedings of the 11th Asian Test Symposium, (Ats'02), IEEE, 2002, 3 pp.

Larsson, a. et al., "Test-Architecture Optimization and Test Scheduling for SOCs with Core-Level Expansion of Compressed Test Patterns," Edaa, 2008, pp. 188-193.

Nadeau-Dostie, B. et al., "Improved Core Isolation and Access for Hierarchical Embedded Test," IEEE Design & Test of Computers, Jan./Feb. 2009, pp. 18-25.

Remmers, J. et al.,"Hierarchical DFT Methodology—A Case Study," ITC International Test Conference, IEEE, 2004 Paper 30.2, pp. 847-856.

Sinanoglu, O. et al., "A Non-Intrusive Isolation Approach for Soft Cores," EDAA, 2007, pp. 27-32.

Srinavasan, P. et al., "Hierarchical DFT with Combinational Scan Compression, Partition Chain and RPCT," 2010 IEEE Annual Symposium on VLSI, IEEE, 2010, pp. 52-57.

Su et al., "Multiple Path Sensitization for Hierarchical Circuit Testing," IEEE 1990 International Test Conference, Paper 6.2, pp. 152-161.

Su et al., "Computer-Aided Design of Pseudoexhaustive BIST for Semiregular Circuits," 1990 IEEE International Test Conference, 1990, Paper 30.4, pp. 680-689.

Wohl, P. et al., "Fully X-tolerant Combinational Scan Compression," 2007 IEEE International Test Conference, IEEE, 2007, Paper 6.1, pp. 1-10.

Wohl, P. et al., "Minimizing the Impact of Scan Compression," 25th IEEE VLSI Test Symposium (VTS'07), IEEE, 2007, 8 pages.

Xu, Q. et al., "Modular and Rapid Testing of SOCs With Unwrapped Logic Blocks," IEEE Transactions on Very Large Scale Integration (VLSI) Systems, Nov. 2005, pp. 1275-1285, vol. 13, No. 11.

* cited by examiner

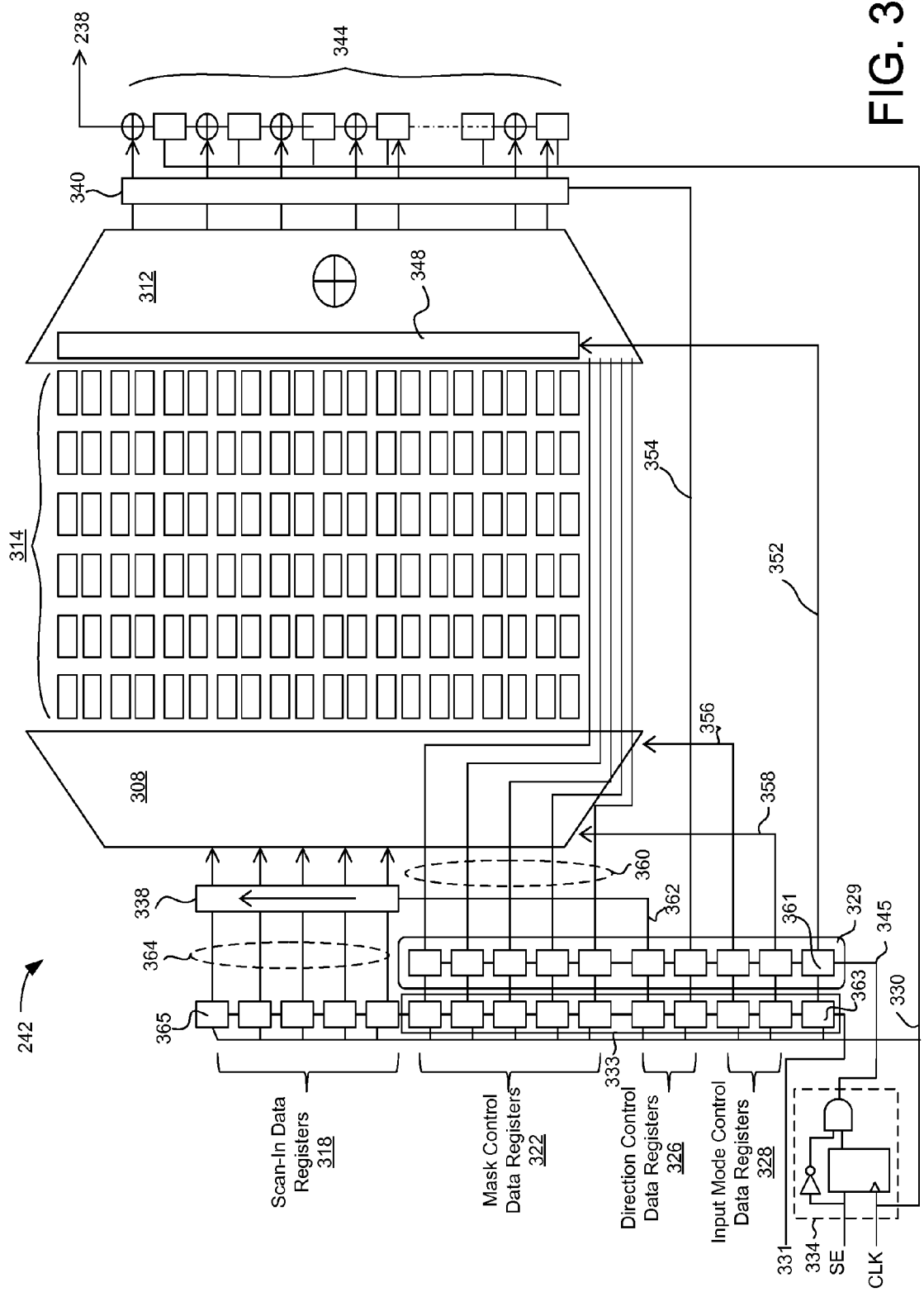

9,411,014 B2

REORDERING OR REMOVAL OF TEST PATTERNS FOR DETECTING FAULTS IN INTEGRATED CIRCUIT

CROSS REFERENCE TO RELATED APPLICATIONS

This application claims the benefit of priority under 35 U.S.C. §119(a) to Indian Provisional Application No. 1262/CHE/2013, filed Mar. 22, 2013, which is incorporated by reference in its entirety.

BACKGROUND

1. Field of the Disclosure

The present disclosure relates to reordering or removing of test patterns in a test pattern set for testing of an integrated circuit using automatic test equipment (ATE).

2. Description of the Related Art

A defect is an error introduced into an integrated circuit (IC) during a semiconductor manufacturing process. Defects that alter the behavior of the IC can be described by a mathematical fault model. During testing of the IC, a test pattern is applied to the IC and logic value outputs from the IC are observed. When the IC is operating as designed, the logic value output coincides with expected output values specified in test patterns. A fault in the IC is detected when the logic value output is different than the expected output.

Automatic Test Pattern Generation (ATPG) refers to an electronic design automation (EDA) process that generates a set of test patterns for applying to an IC to detect faulty behavior caused by defects in the IC. The generated patterns are used to test semiconductor devices after manufacture, and in some cases to assist with determining the cause of fault. The fault model may be used to generate the test patterns that effectively covers certain types of faults with a fewer number of test patterns.

To receive and detect faults in the IC, the IC includes a test circuit that receives and applies the test patterns to one or more scan chains. A scan chain includes a row of multiple scan flops that output a certain logic value when the test pattern is applied. An unexpected output of a scan flop is indicative of certain faults or defects in circuit components associated with the scan flop. Outputs of multiple scan flops may be compressed into a bit stream to reduce data bandwidth and pins associated with the testing of IC.

SUMMARY

Embodiments relate to reordering test patterns from a test pattern set used to test an integrated circuit using productivity indices of test patterns. Productivity indices are determined for the test pattern included in the test pattern set. The test pattern set includes a first test pattern and a second test pattern appearing later than the first test pattern. The productivity indices for a first test pattern included in the test pattern set and a second test pattern included in the test pattern set are compared. If the productivity index of the second test pattern is higher than the productivity index of the second test pattern, the first test pattern and the second test pattern are swapped in the test pattern set so that the second test pattern appears earlier than the first test pattern in a modified test pattern set.

In some embodiments, the test pattern set is divided into multiple groups. A set number of test patterns with the lowest productivity indices are selected from a current group. A set number of test patterns with the highest productivity indices are selected from a next group. The productivity indices of the selected test patterns from the current group are compared to the productivity indices of the selected test patterns from the next group. The test patterns from the selected test patterns that have larger productivity indices than the test patterns from the selected test patterns from the next group are swapped.

BRIEF DESCRIPTION OF THE DRAWINGS

The teachings of the embodiments can be readily understood by considering the following detailed description in conjunction with the accompanying drawings.

FIG. 3A is a circuit diagram of a test circuit in the DUT, according to one embodiment.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1A:
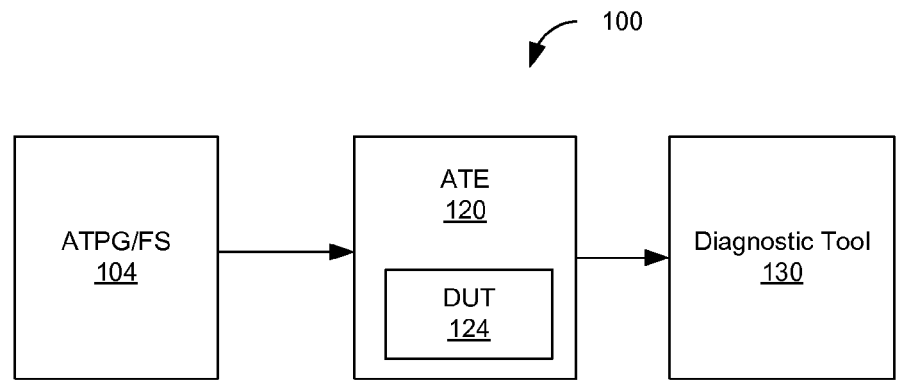
FIG. 1A is a block diagram illustrating a system for testing and diagnosing a device under test (DUT), according to one embodiment.

FIG. 1A is a block diagram illustrating a system 100 for testing and diagnosing a device under test (DUT) 124, according to one embodiment. DUT 124 is an integrated circuit (IC) that is being tested for faults in its fabrication process. The system 100 may include, among other components, an automatic test pattern generator/fault simulator (ATPG/FS) 104, an automatic test equipment (ATE) 120, and a diagnostic tool 130. One or more of these components may be combined into a single product or device.

ATPG/FS 104 generates test patterns provided to ATE 120 and scan-out values corresponding to the test patterns for detecting faults in DUT 124. Scan-out values represent the expected output from a faultless integrated circuit when provided with the test patterns. A test pattern includes scan-in data and control data for controlling test operation in DUT 124, as described below in detail with reference to FIG. 3A. ATE 120 provides the test patterns as scan-in data and control data to DUT 124, and captures output from DUT 124. The captured output from DUT 124 is compared with scan-out values. ATE 120 then generates fault data indicating the difference in the scan-out values and the output from DUT 124.

ATE 120 then sends fault data to diagnostic tool 130 to localize and diagnose the cause of faults in DUT 124. If a fault is detected based on an unexpected output of DUT 124, diagnostic tool 130 may request ATPG/FS 104 to generate further test patterns to localize or specify a scan flop associated with the unexpected value.

Figure 1B:
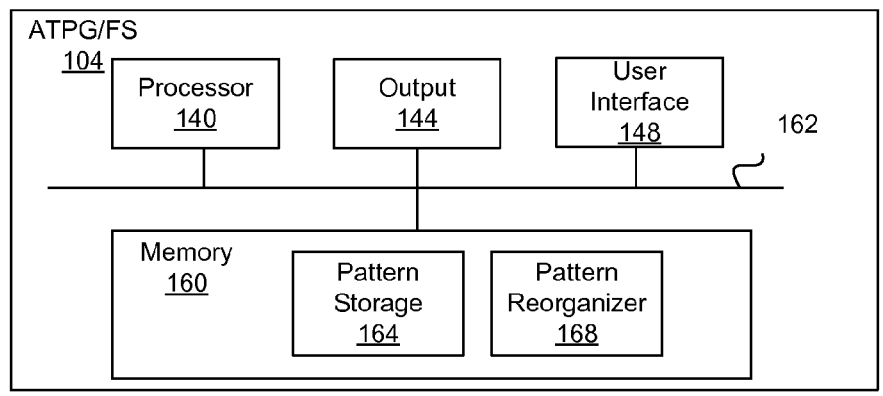
FIG. 1B is a block diagram of an automatic test pattern generator/fault simulator (ATPG/FS), according to one embodiment.

FIG. 1B is a block diagram of ATPG/FS 104, according to one embodiment. ATPG/FS 104 may include, among other components, a processor 140, an output module 144, a user interface 148, memory 160 and a bus 162 connecting these components. Processor 140 retrieves instructions from memory 160 and executions the instructions to perform various operations, including reordering or removal of test patterns in a test pattern set.

Output module 144 is hardware, firmware, software or a combination thereof for sending the test patterns to ATE 120 via a communication medium (e.g., wire). For this purpose, output module 144 may implement various communication protocols.

User interface 148 enables users to interact with ATPG/FS 104. User interface 148 may include output devices such as a monitor and input devices such as keyboard or mouse.

Memory 160 is a non-transitory computer-readable storage medium that stores, among other information, computer instruction modules including instructions to be executed by processor 140. Memory 160 includes pattern storage 164 and pattern reorganizer 168. Pattern storage 164 stores one or more sets of test patterns to be fed to DUT 124 via ATE 120 for testing. The sets of test patterns in pattern storage 164 may be generated in ATPG/FS 104 or these sets of test patterns may be generated on an external system and stored in ATPG/FS 104. Pattern reorganizer 168 is an instruction module for analyzing a set of test patterns stored in pattern storage 164 and generating another set of test patterns modified from the set of test patterns for achieving increased fault coverage at a faster speed and possibly with fewer test patterns.

Figure 2:
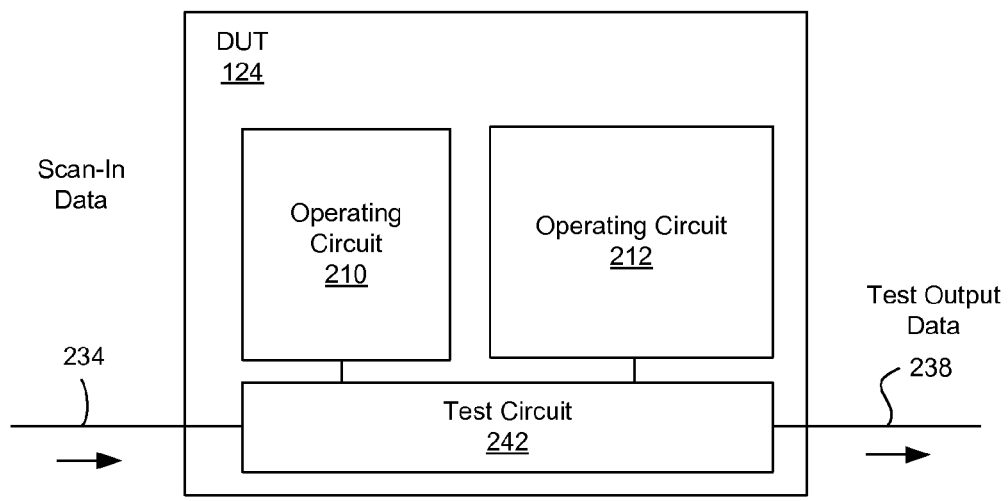
FIG. 2 is a block diagram of a DUT including a test circuit, according to one embodiment.

FIG. 2 is a block diagram of DUT 124 including a test circuit 242 for performing testing of sub-circuits in DUT 124, according to one embodiment. DUT 124 may include, among other components, one or more sub-circuits 210, 212 and test circuit 242. DUT 124 may have a plurality of pins connected to the sub-circuits 210, 212 and test circuit 242. Since the number of pins on an integrated circuit (IC) is limited, pins are often multiplexed to perform more than one function. One of such multiplexed function is receiving scan-in data 234 (i.e., test patterns) from ATPG/FS 104 and sending test output data 238 (i.e., an output in response to the test patterns) to diagnostic tool 130.

Test circuit 242 includes hardware circuitry providing scan-in data 234 to chains of scan flops. Test circuit 242 also generates test output data 238 corresponding to scan-in data 234. It is generally advantageous for test circuit 242 to be connected to fewer pins, perform testing at a high speed, and obtain higher fault coverage with fewer test patterns.

Although test circuit 242 is illustrated in FIG. 2 as testing both sub-circuits 210, 212, more than one test circuit may be provided in DUT to separately test a certain sub-circuit. In embodiments with multiple test circuits, each test circuit may be connected to the same or different pins.

FIG. 3A is a circuit diagram of test circuit 242 in the DUT 124, according to one embodiment. Test circuit 242 may include, among other components, a decompressor 308, a compressor 312, chains of scan flops 314, input registers 318, 322, 326, 328, 329, output register 344, input direction block 338, output direction block 340, and control logic 334. Test circuit 242 provides scan-in data 234 to the scan flops 314 via input direction block 338 and generates test output data 238 by operating circuit components according to control values stored in current control registers 329.

Control logic 334 synchronizes the operation of components in test circuit 242 by providing a clock signal via line 345. When a clock signal is input to current control registers 329, the bit values in control registers 333 are loaded onto current control registers 329. The control circuit receives scan enable (SE) signal and clock signal (CLK). SE signal indicates that the test circuit 242 should be activated to perform testing operation. CLK signal is used for synchronizing the operation of various components in test circuit 242. Control logic 334 includes a flip-flop, an AND gate and an inverter but different combinations or structures may also be used.

Bit values of scan-in data and control data are stored in corresponding registers by sequentially shifting bit values from register 363 at the bottom of the register chain up to a scan-in data registers 365 at the top of the register chain as bits for the current test pattern is received via line 331. Although a single line 331 is illustrated in FIG. 3A as receiving the scan-in data and the control data, more than one line may be used to transmit scan-in data and the control data to corresponding registers. Registers 333 shift values from scan-in data received via line 331 to scan-in data registers 318. At the end of the shifting process to store scan-in data in scan-in data registers 318, SE signal goes low and control logic 334 drives current registers 329 via line 345. Current registers 329 stores control values until the next capture clock so that decompressor 308 and compressor 312 can be controlled without undergoing change with every shift of scan-in data. That is, registers 333 enable control values to be shifted to register 329 only once per pattern.

Scan-in data registers 318 store bit values for scan-in data that is fed to decompressor 308 via line 364 and input direction block 338. The stored scan-in data is sent via lines 364 and input direction block 338 to decompressor 308.

Figure 3B:
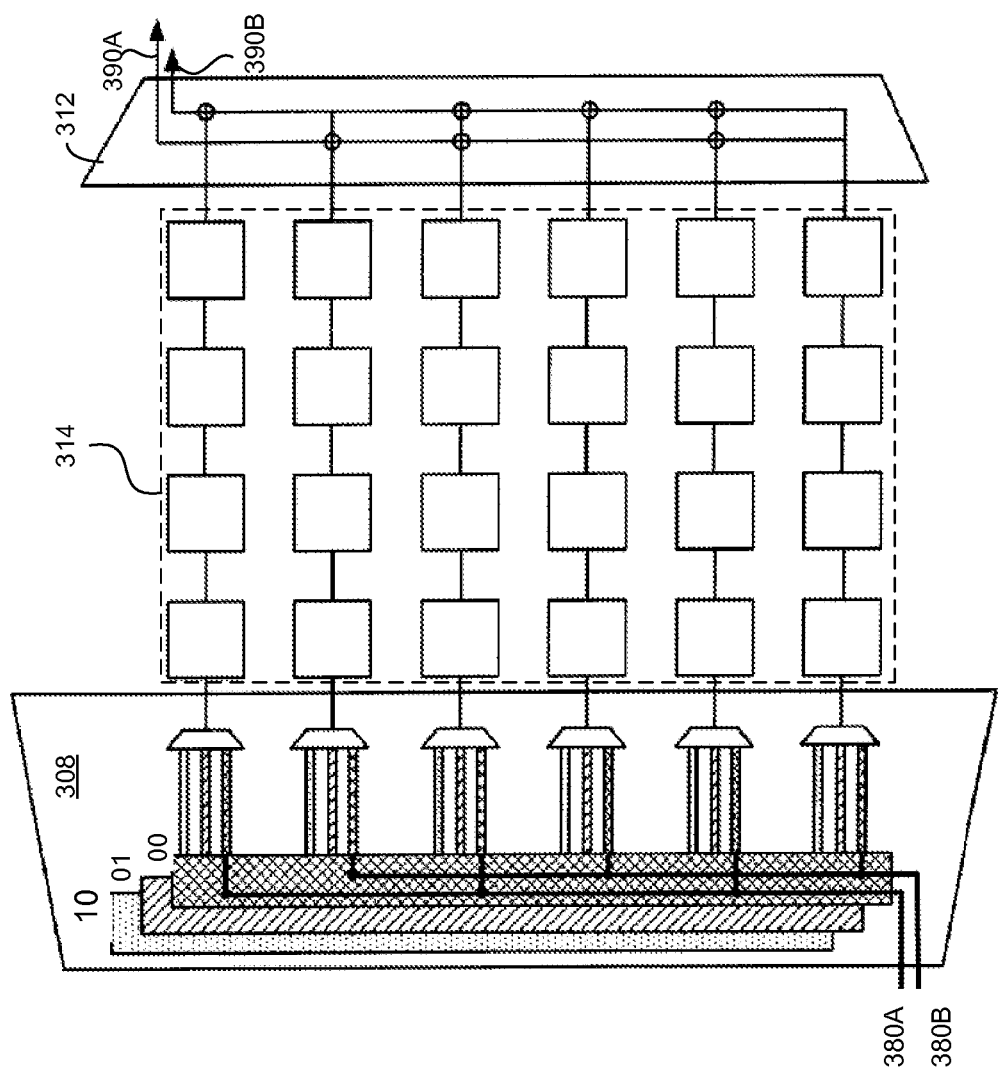
FIG. 3B is a conceptual diagram illustrating the operation of decompressor and compressor in a test circuit, according to one embodiment.

Decompressor 308 may operate in one of multiple modes as set by bit values in input mode control data registers 328 received via lines 356, 358. Each mode of decompressor 308 maps scan-in data to certain scan flops, as described below in detail with reference to FIG. 3B. Bit values in scan-in data registers may be provided to decompressor 308 in a forward direction (i.e., down-up direction) by input direction block 338 (as shown in FIG. 3B) or a reversed direction (i.e., up-down direction) based on the bit value provided by line 362.

Bit values in mask control data registers 322 of the current control registers 329 define the masking of certain scan chains. The bit values of mask control data registers 322 are provided to compressor 312 via lines 360. In response to receiving mask enable signal via line 352 and active signals in lines 360, a mask block 348 in compressor 312 masks certain scan chains as defined by the bit values of mask control data registers 322. The mask enable bit value stored in register 361 is sent to mask block 348 to enable or disable masking operation via line 352. Masking is done for the purpose of, for example, blocking scan chains capturing unknown values (referred to as "X") during unloading process.

A bit value in direction control data registers 326 of the current control registers 329 is sent to output direction block 340 via line 354 to control the direction of outputs from compressor 312. Outputs from scan flops 314 are exclusive OR (XOR) processed by compressor 312 to generate compressed outputs. These compressed outputs pass through the direction control logic 340 to register 344. The compressor outputs are stored in output registers 344. The bit values in output registers 344 are XOR processed into test output data 238. In the embodiment of FIG. 3A, the bit values in test output data 238 is output in a forward direction (i.e., top first and bottom last). However, the bit values in output registers may be output in a reverse direction (i.e., bottom first and top last) if the bit value received via line 354 is reversed.

Some of current control registers 329 store bit values for a current test pattern and other current control registers 329 store bit values for a previous test pattern preceding the current test pattern. Specifically, bit values in input mode control data registers 328 of current control registers 329, and a bit value in direction control data registers 326 of current control registers 329 controlling input direction block 338 for the scan-in data of the current test pattern are for the current test pattern. Conversely, bit value in direction control data registers 326 of current control registers 329 controlling output direction block 340 for the current test pattern, bit values in mask control data registers 322 of current control registers 329, a bit value in mask enable register 361 of current control registers 329 are for the previous test pattern. This mixture of control values at 329 is due to the fact that, while one pattern is being loaded through line 331, the previous pattern is being unloaded through line 238.

FIG. 3B is a conceptual diagram illustrating the operation of decompressor 308 and compressor 312 in a test circuit, according to one embodiment. Decompressor 308 may be selected to operate in one of the selected input modes (labeled as "00", "01", and "10" in FIG. 3B) based on signals provided by lines 356, 358. Each mode may provide different mappings to route scan-in data 380A, 380B (only two bits of scan-in data are shown in FIG. 3B for simplification) received from scan-in data registers 318 to scan flops 314. This mapping provides an efficient way to handle dependencies of bit patterns to be applied to scan flops 314.

In compressor 312, the outputs from the rows of scan flops (i.e., scan chains) are XOR processed into fewer number of compressor outputs 390A, 390B. Outputs from each column of scan flops are fed sequentially to the compressor 312. Certain combinations of the outputs from the scan flops are XOR processed to generate compressor outputs 390A, 390B.

By compressing the outputs for the scan flops, the amount of data to be transmitted to ATE 120 and diagnostic tool 130 may be reduced. The disadvantage of compressing the outputs from the scan flops is that, when an unexpected value representing a fault occurs in the outputs 390A, 390B, the scan flop causing the fault may not be localized. Further test patterns or analysis may be needed to determine the exact scan flop associated with the fault.

For example, the compressor of FIG. 3B compresses the output of the test circuit into two output values 390A and 390B. Output 390A of FIG. 3B is the result of the XOR operation between the output of the first scan chain, the third scan chain, the fourth scan chain, the fifth scan chain and the sixth scan chain. Hence, an unexpected value in output 390A may originate from faults associated with any one or more of the first scan chain, the third scan chain, the fourth scan chain, the fifth scan chain and the sixth scan chain. Similarly, output 390B of FIG. 3B is the result of the XOR operation between the output of the second scan chain, the third scan chain, the fifth scan chain and the sixth scan chain. Hence, an unexpected value in output 390B may originate from faults associated with any one or more of the second scan chain, the third scan chain, the fifth scan chain and the sixth scan chain. In order to identify the exact scan chain and/or scan flop causing the unexpected values in the outputs, additional test patterns or analysis may be needed.

Figure 4:
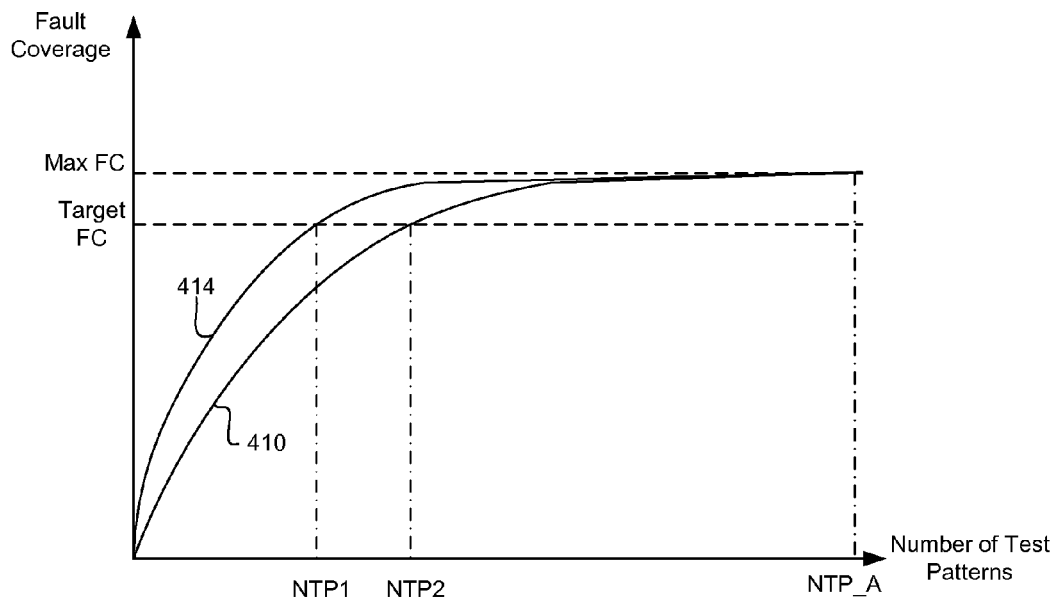
FIG. 4 is a graph illustrating the relationship between fault coverage and the number of test patterns.

FIG. 4 is a graph illustrating the relationship between fault coverage and the number of test patterns. Depending on how the test patterns are organized in a test pattern set, different test pattern sets including the same test patterns may result in fault coverage of different slopes. For example, a set of test patterns having test patterns ordered in a sequence may be represented by fault coverage curve 410 while another set of test patterns having the same patterns ordered in different sequence may be represented by fault coverage curve 414 that has a steeper slop, even though the maximum fault coverage Max FC reachable with both sets of test patterns at the conclusion of the last test pattern is the same. The total number of test patterns in either set of test patterns is indicated as NTP_A in FIG. 4, at which point MAX FC is reached.

It is generally advantageous to use a set of test patterns that result in a higher fault coverage with a fewer number of patterns. For example, target fault coverage (FC) lower than the maximum fault coverage may be sufficient and the entire test patterns need not be fed into DUT 124 in certain circumstances. In such cases, a set of test patterns with fault coverage curve 414 can reach the target fault coverage with NPT1 number of test patterns whereas the other set of test patterns with fault coverage curve 410 can reach the same target coverage with NPT2 number of test patterns (which is larger than NPT1). Embodiments relate to reorganizing or removing test patterns in a set of test patterns so that a higher fault coverage can be attained with test patterns that appear earlier in the set of test patterns.

Figure 5:
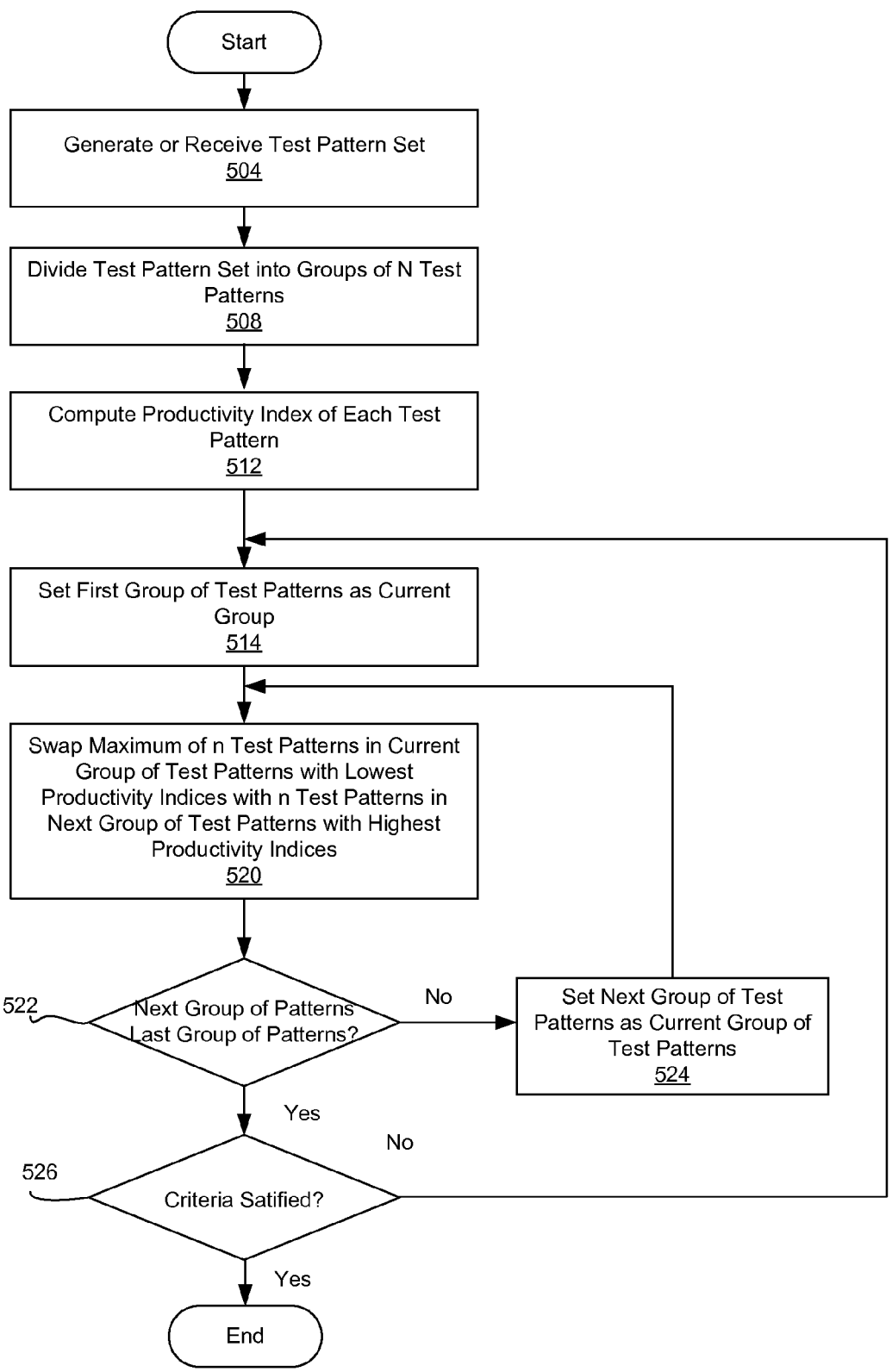
FIG. 5 is a flowchart illustrating a method of reordering test patterns in a test pattern set, according to one embodiment.

FIG. 5 is a flowchart illustrating a method of reordering test patterns for increased efficiency, according to one embodiment. First, a test pattern set for reordering is generated or received 504 at a pattern reorganizer 168.

The test patterns are then divided 508 into groups of N number of test patterns according to the sequence of test patterns. For example, the first group of test patterns may include first through 32nd test patterns, a second group of test patterns may include 33rd through 64th test patterns, and a third group of test patterns may include 65th test patterns through 96th test patterns, and so on.

As described below in detail with reference to step 512, N describes the range within which non-uniformity of productivity is allowed. N may be set to control how extensive swaps can be within the test pattern set. A smaller N indicates that the swaps of test patterns between groups can happen more extensively whereas a larger N indicates that the swaps will be less extensive and a greater degree of non-uniformity in the productiveness of the test patterns will be permitted.

Productivity index is computed 512 for each test pattern at ATPG/FS 104. The productivity of test patterns can be parameterized by various measures. The number of faults covered by a test pattern may not be a good indication of the productivity of the test patterns. Some faults are detected by many test patterns whereas some faults are detected by few test patterns. If a test pattern merely detects mostly faults that are already detected by preceding test patterns, detecting of a large number of faults does not necessarily mean that the test pattern is more productive. In such case, the test pattern merely performs redundant testing that was already performed by other preceding test patterns. Conversely, a test pattern detecting few faults, all or most of which are undetectable by other preceding test patterns may be deemed productive even if the overall number of faults detected by the test patters is small. Embodiments are advantageous, among other reasons, because the productivity index can be computed once at ATPG/FS 104 and no subsequent computation of productivity index is performed.

An actual incremental fault coverage may be used as an effective productivity index of a test pattern to gauge how productive the test pattern is. An actual incremental indicates how many additional number of faults are detected by a given test pattern but not detectable by other test patterns preceding the given test pattern in the test pattern set. For example, if a fifth test pattern detects 2000 fault, of which 1000 faults are not detectable by first through fourth test patterns, the actual incremental index for the fifth test pattern is 1000.

However, since the actual increment fault coverage changes every time the location of test patterns change, the overhead for computing the actual increment fault coverage may be high. For example, if the fifth test pattern in the previous example is moved to swap with a tenth test pattern, a new calculation and simulation is needed to determine how many incremental faults the fifth test pattern would detect in the tenth location. Such recalculation and simulation is very time consuming and computationally intensive.

Hence, embodiments use pseudo incremental fault coverage as the productivity index of the test patterns. The pseudo incremental fault coverage for a test pattern is calculated only once when the test pattern set is in an original sequence, and its value is retained even when the location of the test pattern changes. Since the pseudo incremental fault coverage is not recalculated, the computation associated with computing the productivity index is significantly reduced. Although not as accurate as the actual incremental fault coverage, the pseudo incremental fault coverage functions as a reasonable measure of the productivity of test patterns. Using the pseudo incremental fault coverage is also advantageous because the computation may be done once within ATPG/FS 104, and no further fault simulation is needed.

The first group of test patterns in the test pattern set is then set 514 as the current group.

An efficient test pattern set should have a productive test pattern appear early on in the sequence while less productive test pattern should appear later in the sequence. Having productive test patterns earlier on enables the test pattern set to cover a large number of faults with a fewer number of test patterns. Hence, embodiments swap 520 less productive test patterns in a group with more productive test patterns from a next group, as determined by comparing the productivity indices. The swapping of test patterns consumes computation resources, and hence, a maximum number of test patterns in a group swappable with test patterns in a next group may be set to a certain value "n." A higher "n" indicates that more patterns are likely to be swapped during a single pass through all the groups.

Figure 6:
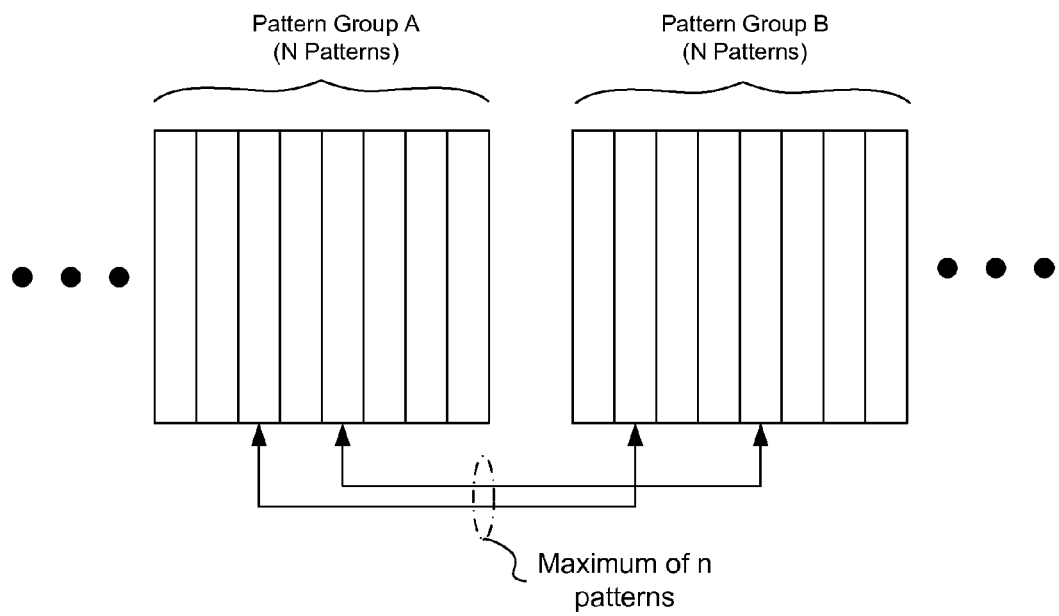
FIG. 6 is a diagram illustrating switching of test patterns in two groups of test patterns, according to one embodiment.

In one embodiment, the swapping is done by selecting "n" test patterns with the lowest productivity indices in a current group and selecting "n" test patterns with the highest productivity indices in the next group. Then the productivity indices of selected test patterns in the current group are compared with the productive indices of selected test patterns in the next group. If at least one of the selected test patterns in the current group has a lower productivity index compared to the selected test patterns from the next group, the test patterns with lower productive indices in the current group are swapped with test patterns with higher productive indices in the next group. Referring to FIG. 6, a maximum "n" number of test patterns in pattern group A are swapped with a corresponding number of test patterns in pattern group B that follow pattern group A. The actual test patterns switched may be less than the maximum "n."

Referring back to FIG. 5, the pattern reorganizer 168 determines 522 whether the next group of patterns is the last group of patterns after swapping the test patterns. If the next group of patterns is not the last group of patterns, the next group of patterns is set 524 as the current group of test patterns and swapping 520 is performed.

If the next group of patterns is the last group of patterns, then the process proceeds to determine 526 if a criteria for terminating the process is satisfied. The criteria may be one or more of (i) whether a fixed number of passes were done through the entire groups (e.g., three total passes) and (ii) whether a certain level of uniformity of productivity of test patterns in each group was achieved.

As described with reference to FIG. 3A, certain bit values stored in current control registers 329 correspond to control data for the current test pattern, and some of the bit values stored in current control registers 329 correspond to control data for a previous test pattern preceding the current test pattern. As such, the swapping of test patterns includes modifying control data in test patterns appearing before the swapped test patterns, as described below in detail with reference to FIGS. 7A and 7B. Also, the swapping includes adjusting and modifying the scan-out data to account for the swapping of the test patterns, for example, using simulation, since the test patterns have forward dependency.

If it is determined that the criteria is not satisfied, the process returns to setting 514 the first group of test patterns as the current group and then repeats the subsequent processes.

The sequence and steps illustrated in FIG. 5 are merely illustrative. For example, the step 508 of dividing the test pattern and the step 512 of computing the productivity index may be reversed in order. Moreover, the step 526 of determining if the criteria are satisfied may be omitted, and the reordering process may be performed in a single pass.

Further, instead of setting the first group of test patterns as a current group of test patterns in step 514, the last group of test patterns may be set as the current group. In this case, a maximum of "n" test patterns in the current group of test patterns with lowest productivity indices are swapped with a corresponding number of test patterns from a previous group of test patterns with highest productivity indices. That is, the comparison and swapping steps is reversed in order, starting from the last group of test patterns and proceeding to the first group of test patterns. In step 524, a group of test patterns preceding the current group is set as the next current group in this embodiment. In some embodiment, some sweeps are performed in the order illustrated in FIG. 5 while other sweeps are performed in the reverse order (i.e., from the last group to the first group).

If the criteria are satisfied, then the process terminates. The test pattern set as modified according to the embodiment of FIG. 5 is then provided to DUT 124 via the ATE to test the DUT 124.

In one or more embodiments, dependencies of test patterns are taken into account when swapping test patterns of different groups. A test pattern includes scan-in data and control data for controlling test operation in DUT 124, as described above in detail with reference to FIG. 3A. Some of the control data in the current test pattern are applicable to the current test pattern (e.g., control data for controlling output direction block 340, mask control data and mask enable data) but other control data in the current test pattern are applicable to the next test pattern and not the current test pattern (e.g., input mode control data, and direction control data for controlling input direction block 338). Hence, when swapping test patterns, the control data of the swapped test patterns as well as the control data of the test pattern preceding and succeeding the swapped test patterns are rearranged.

Figure 7A:
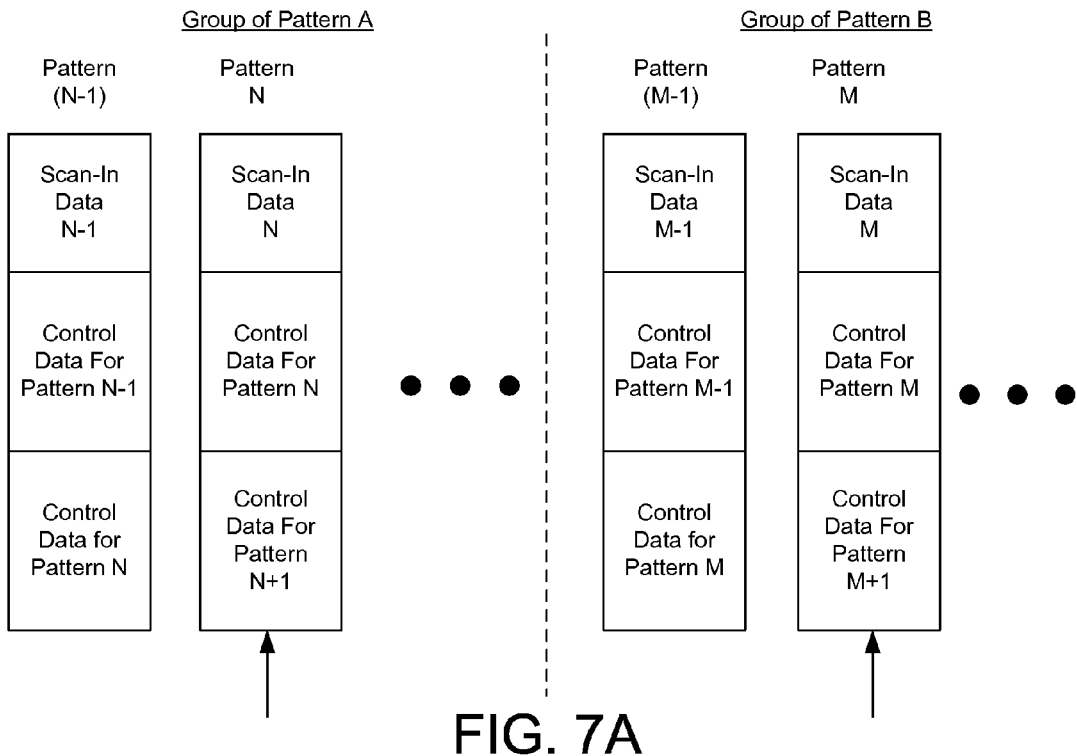
FIGS. 7A and 7B are diagrams illustrating switching of control data associated with compression test patterns being switched, according to one embodiment.
Figure 7B:
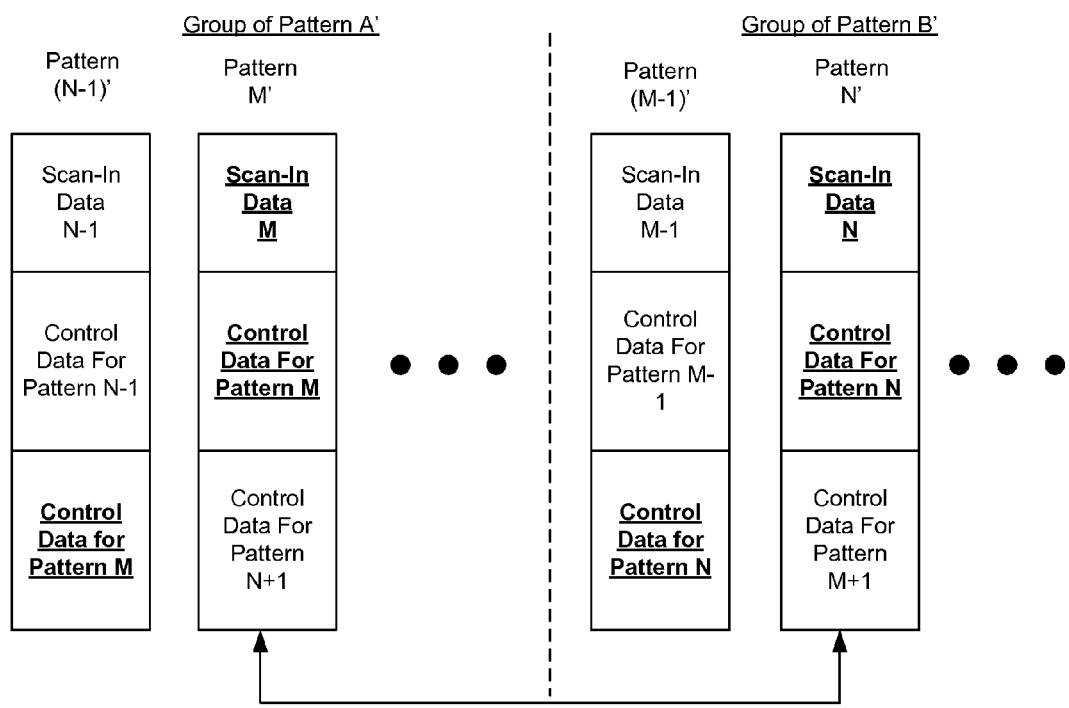

FIGS. 7A and 7B are diagrams illustrating switching of control data associated with test patterns being swapped, according to one embodiment. In FIG. 7A illustrates test pattern N in group A and test pattern M in group B before the swapping. As illustrated in FIG. 7A, test pattern N includes scan-in data N, control data for pattern N, and control data for pattern (N+1), and test pattern M includes scan-in data M, control data for pattern M, and control data for pattern (M+1). When swapping pattern N with pattern M, scan-in data and control data for the current data may be swapped together, but control data for the next pattern should be retained in the original locations. Moreover, some of the control data in previous patterns (i.e., pattern (N−1) and pattern (M−1)) are also updated so that the swapped test patterns can operate the test circuit 242 as designed.

FIG. 7B illustrates patterns in group A' and group B' after swapping of pattern N and pattern M occurred, according to one embodiment. In this example, pattern M' includes scan-in data M and control data for pattern M. It is to be noted that control data for pattern (N+1) previously in pattern N remains in pattern M'. In addition, pattern (N−1)' includes control data for pattern M which was previously included in pattern (M−1). Pattern N' moved to group B includes scan-in data N, control data for pattern N and control data for pattern (M+1). It is also to be noted that control data for pattern (M+1) previously in pattern M remains in pattern N'. Pattern (M−1)' preceding pattern N' is also updated with control data for pattern N. In summary, when test patterns are swapped, the test patterns preceding the swapped test patterns may also be updated.

Another dependency is the scan-out data for the swapped test patterns. The test output of a test pattern depends on following test patterns fed to the DUT 124 due to XOR processing at compressor 312, as described above in detail with reference to FIG. 3B. Hence, the scan-out data for the swapped test pattern and subsequent test patterns is updated to reflect the changes due to the swapping of the test patterns. The updated scan-out data can be generated by simulating the scan-out data assuming that the DUT 124 is faultless and produces the expected output. The simulation may be selectively performed to parts of the scan-out data of only certain patterns that are affected by the swapping of test patterns as opposed to performing a simulation of the entire test pattern set.

In one or more embodiments, test patterns with low productivity may be dropped from the test pattern set in addition to or in lieu of reordering the test patterns. For example, test patterns having productivity indices below a certain threshold may be removed from the test pattern set. Test patters may be dropped from the test pattern set for other reasons, including but not limited to, (i) the test pattern being redundant, (ii) the test pattern violating clocking requirements, (iii) a user is aware of certain failures but wants to perform the rest of the testing. In such case, in addition to removing certain test pattern, the control data for the removed test pattern included in a previous test pattern may also be updated. Further, simulation may also be performed to determine the scan-out data for test patterns preceding the removed test pattern.

Figure 8:
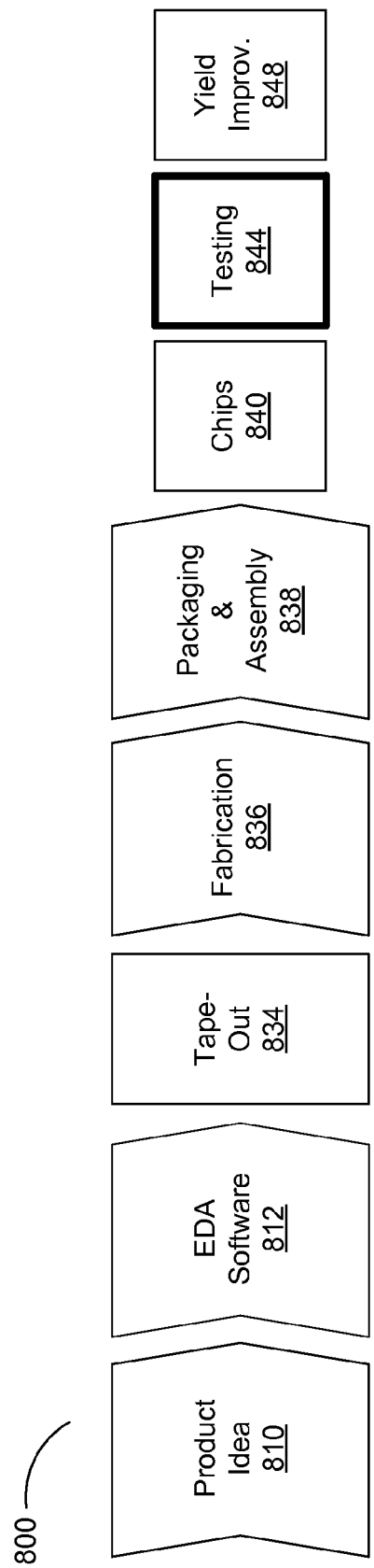
FIG. 8 is a flowchart illustrating the various operations in the design and fabrication of an integrated circuit.

FIG. 8 is a flowchart 800 illustrating the various operations in the design and fabrication of an integrated circuit. This process starts with the generation of a product idea 810, which is realized during a design process that uses electronic design automation (EDA) software 812. When the design is finalized, it can be taped-out 834. After tape-out, a semiconductor die is fabricated 836 to form the various objects (e.g., gates, metal layers, vias) in the integrated circuit design. Packaging and assembly processes 838 are performed, which result in finished chips 840. Chips are then tested 844 to detect faults. Based on the detected faults in the tested chips, measures can be taken to improve yield 848 in subsequent batch of chips to be fabricated. Embodiments described above primarily related to testing 644 the chips for faults.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations may be made in the arrangement, operation and details of the method and apparatus disclosed herein without departing from the spirit and scope of this disclosure.

What is claimed is:

1. A method for reordering a test pattern set for testing an integrated circuit, comprising:
   computing a productivity index for each test pattern in the test pattern set, the productivity index indicating a number of faults detectable by a test pattern but not by other test patterns of the test pattern set preceding the test pattern;
   comparing a productivity index of a first test pattern and a productivity index of a second test pattern, the second test pattern appearing later in the test pattern set than the first test pattern; and
   swapping locations of the first test pattern and the second test pattern responsive to the productivity index of the second test pattern being higher than the productivity index of the first test pattern.

2. The method of claim 1, further comprising:
   dividing the test pattern set into a plurality groups of test patterns;
   selecting a predetermined number of test patterns from a current group having lowest productivity indices;
   selecting the predetermined number of test patterns from a next group having highest productivity indices, the next group subsequent to the current group;
   comparing productivity indices of the selected test patterns in the current group and productivity indices of the selected test patterns in the next group; and
   swapping locations of the selected test patterns in the current group having higher productive indices than the selected test patterns in the next group.

3. The method of claim 2, wherein the current group progressively proceeds from a first group in the test pattern set to a group before the last group.

4. The method of claim 1, wherein a productivity index is a pseudo incremental fault coverage.

5. The method of claim 1, further comprising swapping a first subset of control data in a test pattern appearing before the first test pattern with a second subset of control data in a test pattern appearing before the second test pattern.

6. The method of claim 5, wherein the first subset of control data or the second subset of control data comprises input mode control data for setting a mode of decompressor in a testing circuit of the integrated circuit, and direction control data for controlling input direction of scan-in data to the decompressor in the testing circuit.

7. The method of claim 1, further comprising simulating an operation of the integrated circuit to determine scan-out data for another test pattern set with the swapped first test pattern and the second test pattern.

8. The method of claim 1, wherein fault simulation is not performed after computing the productivity index.

9. An apparatus for reordering a test pattern set for testing an integrated circuit, comprising:
   a processor;
   a pattern storage configured to store a test pattern set; and
   a pattern reorganizer configured to:
      compute a productivity index for each test pattern in the test pattern set, the productivity index indicating a number of faults detectable by a test pattern but not by other test patterns of the test pattern set preceding the test pattern;
      compare a productivity index of a first test pattern and a productivity index of a second test pattern, the second test pattern appearing later in the test pattern set than the first test pattern; and
      swap locations of the first test pattern and the second test pattern responsive to the productivity test pattern of the second test pattern being higher than the productivity test pattern of the first test pattern.

10. The apparatus of claim 9, wherein the patter reorganizer is further configured to:
    divide the test pattern set into a plurality groups of test patterns;
    select a predetermined number of test patterns from a current group having lowest productivity indices in the first group;
    select the predetermined number of test patterns from a next group having highest productivity indices, the next group subsequent to the current group;
    compare productivity indices of the selected test patterns in the current group and productivity indices of the selected test patterns in the next group; and swap locations of the selected test patterns in the current group having higher productive indices than the selected test patterns in the next group.

11. The apparatus of claim 10, wherein the patter reorganizer is further configured to progressively proceed the current group progressively from a first group in the test pattern set to a group before the last group.

12. The apparatus of claim 9, wherein a productivity index is a pseudo incremental fault coverage.

13. The apparatus of claim 9, wherein the patter reorganizer is further configured to swap a first subset of control data in a test pattern appearing before the first test pattern with a second subset of control data in a test pattern appearing before the second test pattern.

14. The apparatus of claim 13, wherein the first subset of control data or the second subset of control data comprises input mode control data for setting a mode of decompressor in a testing circuit of the integrated circuit, and direction control data for controlling input direction of scan-in data to the decompressor in the testing circuit.

15. The apparatus of claim 9, wherein the patter reorganizer is further configured to simulate an operation of the integrated circuit to determine scan-out data for another test pattern set with the swapped first test pattern and the second test pattern.

16. The apparatus of claim 9, wherein fault simulation is not performed after computing the productivity index.

17. A non-transitory computer-readable storage medium storing instructions thereon, the instructions when executed by a processor cause the processor to:
compute a productivity index for each test pattern in a test pattern set, the productivity index indicating a number of faults detectable by a test pattern but not by other test patterns of the test pattern set preceding the test pattern;
compare a productivity index of a first test pattern and a productivity index of a second test pattern, the second test pattern appearing later in the test pattern set than the first test pattern; and
swap locations of the first test pattern and the second test pattern responsive to the productivity test pattern of the second test pattern being higher than the productivity test pattern of the first test pattern.

18. The non-transitory computer-readable storage medium of claim 17 wherein the instructions further cause the processor to:
divide the test pattern set into a plurality groups of test patterns;
select a predetermined number of test patterns from a current group having lowest productivity indices;
select the predetermined number of test patterns from a next group having highest productivity indices, the next group subsequent to the current group;
compare productivity indices of the selected test patterns in the current group and productivity indices of the selected test patterns in the next group; and
swap locations of the selected test patterns in the current group having higher productive indices than the selected test patterns in the next group.

19. The non-transitory computer-readable medium of claim 17, wherein a productivity index is a pseudo incremental fault coverage.

20. The non-transitory computer-readable medium of claim 17, wherein the instructions further cause the processor to:
swap a first subset of control data in a test pattern appearing before the first test pattern with a second subset of control data in a test pattern appearing before the second test pattern.

* * * * *